(12) United States Patent
Fishcer et al.

(10) Patent No.: US 6,596,640 B1
(45) Date of Patent: Jul. 22, 2003

(54) METHOD OF FORMING A RAISED CONTACT FOR A SUBSTRATE

(75) Inventors: Paul B. Fishcer, Portland, OR (US); James A. Boardman, Hillsboro, OR (US); Anne E. Miller, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/177,539

(22) Filed: Jun. 21, 2002

(51) Int. Cl.[7] ............................................. H01L 21/302
(52) U.S. Cl. .................. 438/692; 438/750; 438/754; 438/455; 438/7; 438/10; 438/16; 438/17
(58) Field of Search .................. 438/692, 693, 438/749, 750, 751, 756, 754, 694, 10, 11, 7, 8, 16, 17, 455

(56) References Cited

U.S. PATENT DOCUMENTS 5,244,534 A * 9/1993 Yu et al. ........................ 156/636
6,153,526 A * 11/2000 Shih et al. ..................... 438/692
6,194,313 B1 * 2/2001 Singh et al. ................... 438/675
6,235,633 B1 * 5/2001 Jang .............................. 438/675

* cited by examiner

Primary Examiner—G Goudreau
(74) Attorney, Agent, or Firm—George Chen

(57) ABSTRACT

The present invention includes a method of providing a first substrate; forming an insulator over the first substrate; forming an opening in the insulator; forming a conductor over the insulator and in the opening; removing the conductor over the insulator with a first chemical-mechanical polish process to leave the conductor in the opening; and reducing thickness of the insulator with a second chemical-mechanical process to permit the conductor in the opening to protrude.

The present invention further includes a structure having such a conductor that protrudes.

18 Claims, 2 Drawing Sheets

METHOD OF FORMING A RAISED CONTACT FOR A SUBSTRATE

BACKGROUND OF THE INVENTION

1. Field of the Invention

The present invention relates to the field of semiconductor integrated circuit (IC) manufacturing, and more specifically, to a method of forming raised contacts for a substrate.

2. Discussion of Related Art

In 1965, Gordon Moore first observed that the number of transistors per unit area on a chip appeared to double approximately every 18 months. Ever since then, the semiconductor industry has managed to introduce new designs and processes on schedule to deliver the improvement in device density projected by the so-called Moore's Law. In particular, major enhancements in optics and photolithography have reduced the critical dimension (CD) that can be successfully patterned in the features on a chip or other substrate. At the same time, significant improvements in doping, deposition, and etch have decreased the concentration, depth, and thickness that can be precisely achieved across the substrate.

As device dimensions approach atomic dimensions, the fundamental limitations of physics will play increasingly larger roles in determining the performance and reliability of the devices on the substrate. In the past, issues of scaling have generally involved either the transistor in the front-end of semiconductor processing or the wiring in the back-end of semiconductor processing. However, it is becoming increasingly important to balance the scaling of the transistor and the interconnect on the substrate with the scaling of the interconnection between multiple substrates.

Thus, what is needed is a method of forming raised contacts for interconnection between substrates and a structure having such raised contacts.

BRIEF DESCRIPTION OF THE DRAWINGS

FIG. 1(g) is also an illustration of a cross-sectional view of a structure that includes a plug on a substrate according to the present invention.

FIG. 2 is also an illustration of a cross-sectional view of a structure that includes two substrates interconnected with raised contacts according to the present invention.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

A device may be formed on a substrate by iteratively performing some combination of unit processes such as doping, depositing, patterning, and etching. During the fabrication of integrated circuits (ICs) on a chip or substrate, transistors may be formed in semiconductor material and separated by an electrically insulating material. The transistors may then be wired up with an interconnect system that has multiple layers of an electrically conductive material separated by the electrically insulating material.

A higher device density per unit volume may be achieved by stacking two or more substrates. The substrates may be wired with 3-dimensional interconnects. The 3-dimensional interconnects may involve raised contacts on the substrates. The present invention describes a method of forming raised contacts for interconnection between substrates.

Figure 1A:
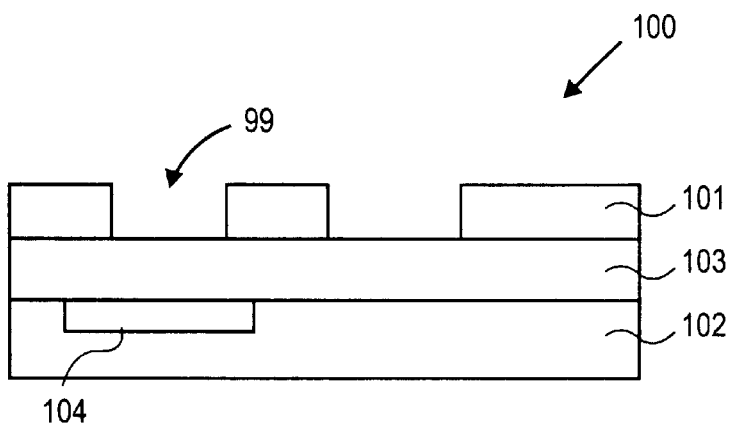
FIGS. 1(a)–(g) are illustrations of a cross-sectional view of various embodiments of a method of forming a raised contact for a substrate according to the present invention.
Figure 1B:
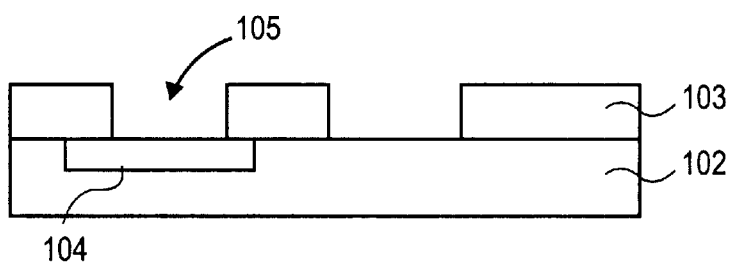
Figure 1C:
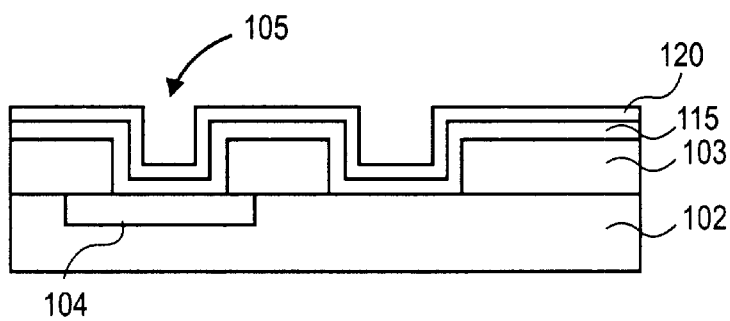
Figure 1D:
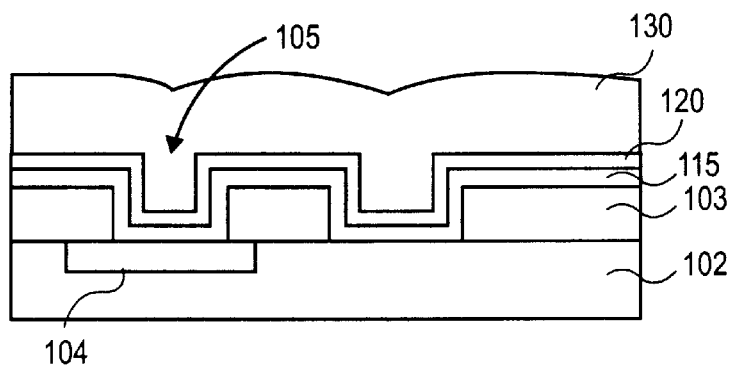
Figure 1E:
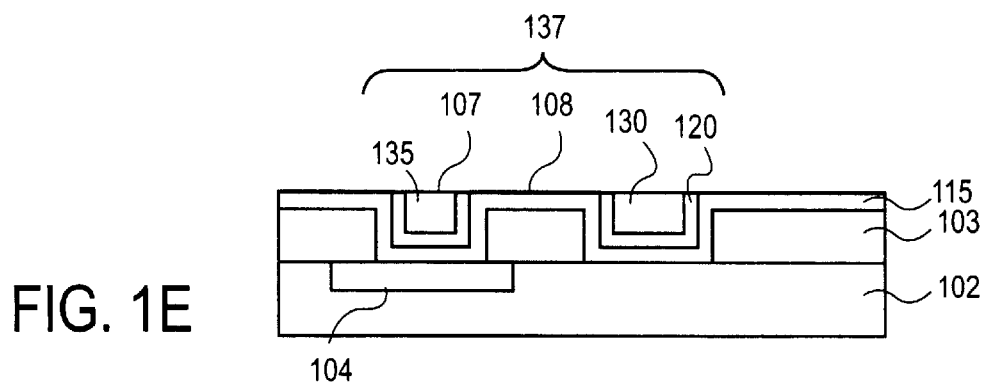
Figure 1F:
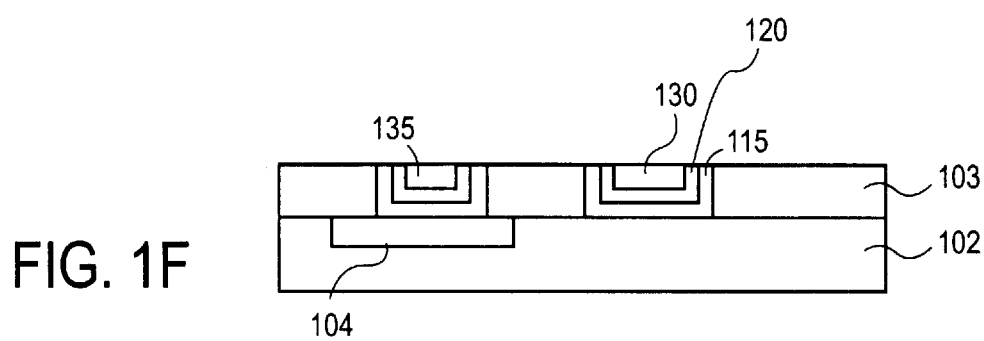
Figure 1G:
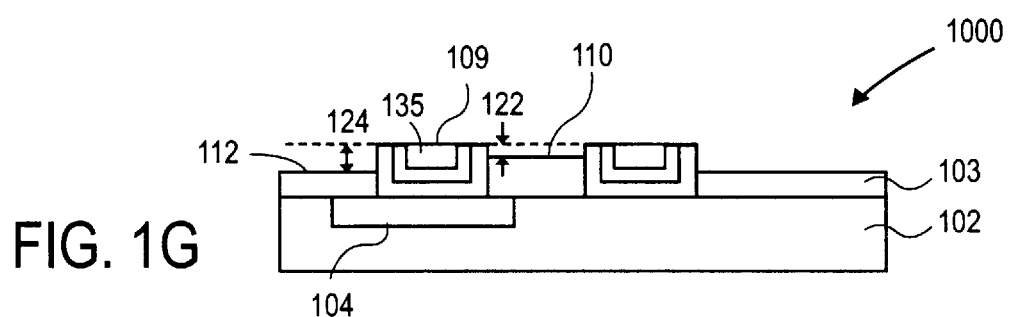
Figure 2:
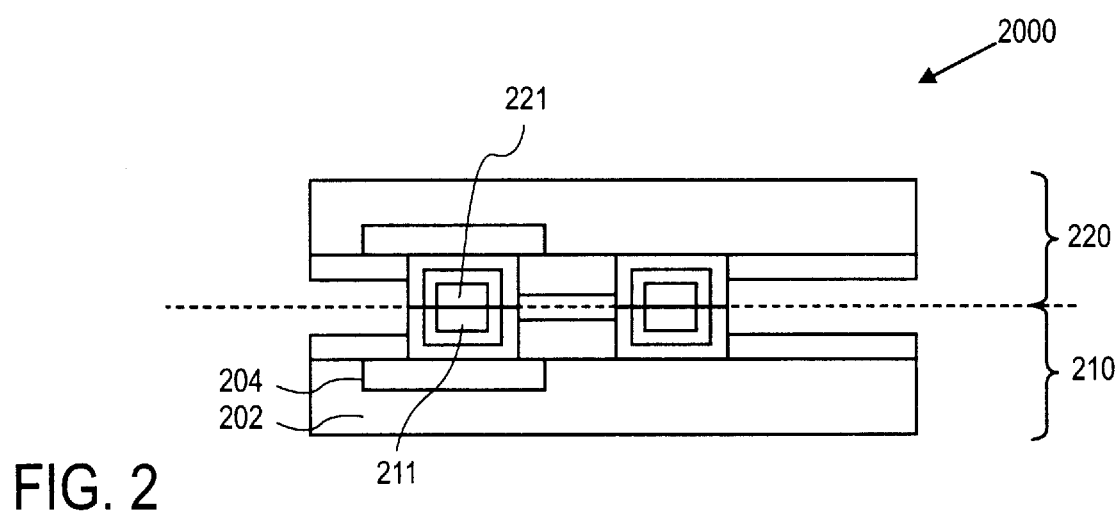
FIG. 2 is an illustration of a cross-sectional view of an embodiment of a method of interconnecting raised contacts between substrates according to the present invention.

Some embodiments of a structure according to the present invention are shown in FIG. 1(g) and FIG. 2.

An embodiment of a structure 1000 that includes a plug 135 on a substrate 100 is shown in FIG. 1(g). The plug 135 may form a raised contact to permit input of a signal to, or output of a signal from, a bond pad 104 connected to an active area of a device in an underlying layer 102 of the substrate 100.

An embodiment of a structure 2000 that includes two interconnected substrates 210, 220 according to the present invention is shown in FIG. 2. The structure 2000 includes a first raised contact 211 for a first substrate 210 that is interconnected to a second raised contact 221 for a second substrate 220. In one embodiment, the raised contact 211 permits input of a signal to, or output of a signal from, a bond pad 204 connected to an active area of a device in an underlying layer 202 of the substrate 210.

Various embodiments of a method of forming raised contacts for a substrate 100 according to the present invention are shown in FIGS. 1(a)–(g) and FIG. 2. A substrate 100 may include a wafer having multiple chips, or a chip having multiple die, or a die having multiple devices.

The substrate 100 may be integrated with a package. Interposers may be used in some cases. The substrate 100 typically includes an underlying layer 102. The underlying layer 102 includes a bond pad 104 that permits input of a signal to or output of a signal from an active area of a device. The device may be active or passive. The bond pad 104 may be formed from an electrically conductive material having a thickness selected from the range of about 2,500.0–12,000.0 Angstroms. The electrically conductive material may include a metal, such as Aluminum or Copper.

The underlying layer 102 may be covered with an insulator 103 formed from an electrically insulating material having a thickness selected from the range of about 5,000.0–24,000.0 Angstroms. The dielectric constant (k) of an electrically insulating material may be determined using capacitance measurements on parallel plate electrical structures. The electrically insulating material may include Silicon Oxide having k with a value of about 3.9–4.2. In one embodiment, an undoped Silica glass (USG) may be used for a device with design rules of about 250 nanometers (nm). A tool that may be used to form the insulator 103 includes an Ultima X™ system from Applied Materials.

The insulator 103 may serve as an interlevel, or interlayer, dielectric (ILD) to separate the bond pad 104 from other electrically conductive materials that may be present in the same or in different levels or layers of the underlying layer 102. Excessive capacitance between nearby electrically conductive lines may degrade the performance of the devices in the underlying layer 102 to which the lines are connected. When the devices include transistors, interline capacitance may contribute to cross-talk and increase the resistance-capacitance (RC) product delay during operation of the transistors, thus degrading their switching speeds.

Interline capacitance in the wiring of the substrate 100 may be reduced by using a low-k material for the insulator 103 between the electrically conductive materials. Low-k refers to a value of k that is lower than the value of k of Silicon Oxide. For a device with design rules of about 180 nm, Silicon Oxide may be doped with Fluorine to form a Fluorinated Silicate glass (FSG or SiOF), having k with a value of about 3.3–3.7. FSG and Silicon Oxide possess many similar properties so process integration is relatively straightforward.

The value of k of FSG is not low enough for devices with smaller design rules so other low-k materials have to be used. A low-k dielectric may include organic materials, silicate materials, or a hybrid of both organic and silicate materials, such as organosilicate glass (OSG). For a device with design rules of about 130 nm, Silicon Oxide may be doped with Methyl (—$CH_3$) groups to form a Carbon-doped Silicon Oxide (CDO or SiOC) having k with a value of about 2.4–3.3.

For a device with design rules of about 90 nm, the insulator 103 may be formed from a low-k material having an ultra-low k. Ultra-low k refers to a value of k that is lower than about 2.2. For a device with design rules of about 70 nm down to about 50 nm, the insulator 103 may be formed from a material having k with a value below about 1.5. Materials with an ultra-low k are usually porous and may include aerogels and xerogels. In some cases, the low-k or ultra-low k material may require the use of a barrier layer to prevent diffusion, intermixing, or reaction with other materials. In one embodiment, a capping layer, such as Silicon Nitride (SiN) or Silicon Oxynitride (SiON), may be formed over the low-k or ultra-low k material.

The insulator 103 may be formed using a chemical vapor deposition (CVD) process. A low-k material that may be formed using a plasma-enhanced CVD (PECVD) process includes Black Diamond™ (a CDO having k with a value of about 2.4–3.1) from Applied Materials, CORAL™ (a CDO having k with a value of about 2.4–2.8) from Novellus Systems, and Flowfill® (a CDO having k with a value of about 2.5–2.8) from Trikon Technologies. An ultra-low k material that may be formed using PECVD includes Orion™ (a CDO having k with a value of about 2.0–2.2) from Trikon Technologies. A tool that may be used to form the low-k or ultra-low k material includes a Producer® system from Applied Materials. A SEQUEL Express™ system or a VECTOR™ system from Novellus Systems may also be used.

Alternatively, the insulator 103 may be formed from a spin-on dielectric (SOD). In some cases, the SOD may require the use of an adhesion layer. Low-k materials that may be formed using a spin-on process from a liquid source include SiLK™ (an aromatic hydrocarbon polymer having k with a value of about 2.65) from Dow Chemical and HOSP™ (a hybrid organic-siloxane polymer or OSG having k with a value of about 2.5) from Honeywell Electronic Materials (HEM). An ultra-low k material that may be spun-on includes NANOGLASS® (a porous Silica having k with a value of about 1.3–2.2) from HEM. A tool that may be used to form the low-k or ultra-low k material includes a spin track from Tokyo Electron Ltd. (TEL).

A mask is defined in a radiation-sensitive material called photoresist 101 by a photolithography process. First, the photoresist 101 is applied over the insulator 103 of the substrate 100. As shown in an embodiment in FIG. 1(a), a feature 99 is patterned in the photoresist 101 by exposure to radiation of the appropriate wavelength and dose, as modulated by a reticle, followed by development to form the mask. The exposure may be done in an imaging tool, such as a stepper or a scanner.

The feature 99 in the photoresist 101 mask may then be transferred into an opening 105 in the insulator 103 by an etch process. The etch process to form the opening 105 may include a plasma etch process or a reactive ion etch process (RIE). The opening 105 uncovers a portion of the bond pad 104 of the device in the underlying layer 102, as shown in an embodiment in FIG. 1(b).

The opening 105 may include a shape derived from the reticle, such as a via, a trench, or a trench overlying a via. The opening 105 may have a vertical dimension, or depth, of greater than about 1.00 micron (um) and a lateral dimension, such as a width, of less than about 0.10 um. High directionality is desired for the etch when the opening 105 has an aspect ratio (depth:width) of about 6:1 or greater. In one embodiment, a high density plasma, such as an inductively-coupled Radio Frequency (RF) plasma (ICP), may be used.

The etch to form the opening 105 may be performed with a gas mixture. The gas mixture may include an etching gas, such as $CF_4$, and a polymerizing gas, such as $CH_2F_2$. The etching gas is the principal source of Fluorine for etching the insulator 103 while the polymerizing gas passivates the sidewalls of the opening 105 to improve selectivity. Other gases that may be used include $CHF_3$ and $C_3F_6$. The etch rate of the insulator 103 may be about 1,500.0–12,000.0 Angstroms per minute.

A tool that may be used to form the opening 105 includes an Omega® MORI™ system from Trikon Technologies. If desired, the etch of the insulator 103, the removal of any underlying barrier layer or etch stop layer, and the strip of the photoresist 101 may be done sequentially in an integrated tool such as an Exelan® system from Lam Research or an eMaX™ EnTek™ Centura® system from Applied Materials.

The etch selectivity of the insulator 103 to a photoresist 101 mask may be about 2:1 to 7:1. If etch selectivity of the insulator 103 to the photoresist 101 mask is too low, an intermediate mask, called a hard mask, may be included between the insulator 103 and the photoresist 101. In such a case, a first etch process is used to transfer a first feature 99 that is patterned in the photoresist 101 into a second feature in the hard mask. Then, a second etch process transfers the second feature from the hard mask into the opening 105 in the insulator 103. The etch selectivity of the insulator 103 to the hard mask may be higher than about 20:1. A hard mask process may include a material such as SiN or SiON. In one embodiment, a stack including two or more hard masks may be used.

If the etch selectivity of the insulator 103 to the underlying bond pad 104 is too low, a buried etch stop (BES) layer may be included between the bond pad 104 and the insulator 103. The etch stop layer may include SiN or Silicon Carbide (SiC). However, SiN has a k with a value of 6.5, which is relatively high, so an alternative material, such as BLOk™ from Applied Materials having a k with a value of about 4.5–5.0, may be used. If desired, an etch stop layer having a k with an even lower value may be used to minimize the capacitance of the overall dielectric stack structure. An example is HOSP BESt™ from HEM which has a k with a value of about 2.6.

When certain materials are used for the seed layer 120 or the conductor 130, a barrier layer 115 may be needed to protect the insulator 103 and the underlying layer 102, including the bond pad 104. For example, the high diffusivity of Copper and the presence of mid-gap states in Copper make a barrier layer 115 necessary. Otherwise, Copper may diffuse into the insulator 103 or underlying layer 102 and degrade the carrier lifetime of a semiconductor material such as Silicon.

A barrier layer 115 is formed over the insulator 103 and in the opening 105. The barrier layer 115 may have a thickness selected from the range of about 50.0–600.0 Angstroms. The barrier layer 115 should provide good coverage both inside and outside the opening 105. In some cases, the thickness of the barrier layer 115 inside the opening may be different from the thickness of the barrier layer 115 outside the opening.

The barrier layer 115 should effectively block diffusion from the seed layer 120 or a conductor 130 into the insulator 103 or underlying layer 102. Serving as an underlayer or liner, the barrier layer 115 should be capable of good adhesion to the seed layer 120, the conductor 130, the insulator 103, and the underlying layer 102, including the bond pad 104. However, the barrier layer 115 should also have minimal interaction, such as chemical or electrochemical reaction, with the seed layer 120, the conductor 130, the insulator 103, or the underlying layer 102, including the bond pad 104.

The barrier layer 115 may be formed from a metal, including a refractive metal, such as Tantalum (Ta), or an alloy, such as Titanium-Tungsten (TiW), or a ceramic, such as Tantalum-Nitride (TaN), Tantalum-Silicon-Nitride (TaSiN), Titanium-Nitride (TiN), or Tungsten-Nitride (WN).

In one embodiment, the barrier layer 115 may include a lower layer of TaN to adhere to the underlying insulator 103 and an upper layer of Ta to adhere to the overlying seed layer 120. Such a bilayer may have a total thickness of about 150.0–350.0 Angstroms.

High directionality is desired for the deposition of the barrier layer 115, especially when the opening 105 has an aspect ratio (depth:width) of about 6:1 or greater. The technique of ionized physical vapor deposition (I-PVD) can deposit a material with better step coverage than other techniques, such as collimation sputtering or long-throw sputtering (LTS). A tool that may be used for I-PVD include an INOVA™ system from Novellus Systems, a Sigma® system from Trikon Technologies, and an Entron system from Ulvac Technologies.

In certain cases, a metal-organic CVD (MOCVD) process may be used to form the barrier layer 115. The precursors used in MOCVD react on the exposed surfaces of the opening 105, rather than in the gas phase as in CVD, so coverage is usually good. A tool that may be used for MOCVD includes a NEXUS™ system from Veeco Instruments.

Alternatively, the barrier layer 115 may be formed using atomic layer deposition (ALD) when a thickness of about 100.0 Angstroms or less is desired. ALD can provide good step coverage and good uniformity even while permitting the use of a low deposition temperature of about 200.0–400.0 degrees Centigrade. A tool that may be used for ALD includes a NEXUS™ system from Veeco Instruments or a LYNX2® or LYNX3™ system from Genus.

When the conductor 130 is to be formed by electroplating, a seed layer 120 is first formed over the barrier layer 115, as shown in an embodiment in FIG. 1(c). In order to serve as a base for electroplating, the seed layer 120 must be electrically conductive and continuous over the barrier layer 115. Adhesion loss of the seed layer 120 or interfacial reaction with the barrier layer 115 should be prevented.

The seed layer 120 may include a metal, such as Copper, or an alloy. The seed layer 120 typically has a thickness selected from a range of about 20.0–2,500.0 Angstroms.

The seed layer 120 may be deposited by I-PVD, especially when the conductor 130 is to be subsequently formed by electroplating. If desired, the barrier layer 115 and the seed layer 120 may be sequentially deposited under vacuum in a tool such as an Endura® Electra™ system from Applied Materials.

When the conductor 130 is to be subsequently formed by PVD, better material properties and surface characteristics may be achieved for the conductor 130 if the seed layer 120 is formed using CVD. The seed layer 120 may also be formed with ALD or electroless plating.

A conductor 130, is formed over the seed layer 120, as shown in an embodiment in FIG. 1(d). The conductor 130 includes a material that is electrically conductive. The seed layer 120 and the conductor 130 may be formed from the same material or from different materials. The conductor 130 should fill the opening 105 from the bottom up. When completely filled, the opening 105 should not have defects, such as voids, seams, or cracks. Adhesion loss of the conductor 130 or interfacial reaction with the seed layer 120 should be prevented.

The conductor 130 may include a metal, such as Copper, or an alloy. The conductor 130 typically has a thickness of about 0.2–2.8 um. Advantages of Copper compared with Aluminum include higher intrinsic conductivity, lower susceptibility to electromigration, and better filling of an opening 105 that has an aspect ratio (height: width) of about 3:1 or greater. Disadvantages of Copper compared with Aluminum include difficulty of etching with a RIE process, vulnerability to corrosion, and a high diffusion rate in Silicon.

The conductor 130 may be formed by an electrochemical process, such as electroplating. Electroplating of the conductor 130 may be performed in a bath or a solution containing ions of the material to be deposited. The seed layer 120 acts as a negative electrode of an electrochemical cell. Electroplating may be carried out in the solution using a constant current, a constant voltage, or variable waveforms of current or voltage, depending on the thickness and the film properties that are desired. When current is turned on, positive ions in the electroplating solution combine with electrons produced at the surface of the seed layer 120. The ions are thus chemically reduced to atoms which form the conductor 130 over the seed layer 120. A tool that may be used for electroplating includes an Electra Cu™ system from Applied Materials, a SABRE™ Electrofill system from Novellus Systems, and a Paragon™ system from SEMITOOL.

Successful electroplating of the conductor 130 may require the use of various additives that are surface active. The additives to the electroplating solution are usually organic and may include functional groups of Sulfur or Nitrogen. Correct filling of an opening 105 having a large aspect ratio may require the proper balance of inhibitors (suppressors) and accelerators in the electroplating solution. Otherwise, defects, such as voids, seams, and cracks, may form within the conductor 130 and be uncovered later during planarization. Good thickness uniformity from substrate-to-substrate and smooth surface finish of the conductor 130 may also require the use of levelers and brighteners in the electroplating solution.

The concentrations of various ions, such as Copper, Chloride, and Hydrogen, in the electroplating solution may be adjusted in response to the monitoring of parameters, such as pH, conductivity, and the absorbance in the visible portion of the electromagnetic spectrum. Cyclic Voltammetric Stripping (CVS) analysis may be used to measure the concentration of the additives in the electroplating solution.

In other embodiments, the conductor 130 may be formed with a PVD process or a CVD process, sometimes without first forming the seed layer 120. A PVD process or a CVD process may be particularly advantageous when filling an opening 105 that has an aspect ratio (height:width) of about 6:1 or greater. In some cases, a MOCVD process may also be used.

During or after formation of the conductor 130, a treatment may be used to modify material properties or surface characteristics of the conductor 130. The treatment of the conductor 130 may include a rapid thermal anneal (RTA) process after deposition to modify or stabilize the grain size of the conductor 130. Copper that has been formed by electroplating may have a grain size of about 0.1–1.0 millimeter (mm), depending on the thickness, deposition conditions, and anneal conditions. A larger grain size in the conductor 130 usually corresponds to a lower resistivity. For example, Copper may have a resistivity of about 1.0–4.0 micro-ohm-centimeter.

A raised contact for the substrate 100 may be formed by planarizing the conductor 130 to form a plug 135, followed by recessing the insulator 103 around the plug 135. A chemical-mechanical polishing (CMP) process, which combines abrasion (mechanical forces) and dissolution (chemical or electrochemical reactions), may be optimized to either planarize or to recess different materials.

The substrate 100 may be held in a carrier attached to a head of a CMP system. A pad may be attached to a table or a platen of the CMP system. When the head and the platen are moved, the pad may apply mechanical forces to the conductor 130 on the substrate 100. The motion of the head and the motion of the platen may be rotary, orbital, or linear. Alternatively, the pad may be moved with respect to the platen, such as with a polishing belt. A slurry may be dispensed on the pad to produce chemical reactions with the conductor 130 on the substrate 100. Abrasives in the slurry may also apply mechanical forces to the conductor 130 on the substrate 100 in conjunction with the pad.

The selectivity of a CMP process may be adjusted by changing the polish rates for different materials. Polish selectivity may be optimized by changing the properties of the polish pad (such as hardness, stiffness, abrasiveness, porosity, and layout of grooves or channels), the properties of the polish slurry (such as chemical composition, chemical concentration, pH, abrasive type, abrasive quantity, and abrasive partide size distribution), and the parameters of the polish system (such as down force or pressure of the carrier relative to the platen, linear velocity of the carrier relative to the platen, slurry flowrate, and platen temperature).

The critical process parameters for a CMP process, such as the polish removal rate and the polish selectivity, may be monitored across the substrate 100 with appropriate sensors. The process parameters may then be controlled by adjusting the related equipment parameters with appropriate actuators. The CMP system may include a control unit, including a computer, and an operator interface. As needed, closed loop control of the CMP process and equipment may be implemented. A closed loop may involve feedforward or feedback control using one or more of the following control methods: proportional, differential, or integral.

The extent to which metrology for a CMP process is performed in-line, on-board, in situ, and in real time depends on the level of cost-of-ownership (CoO) that is acceptable. As desired, a metrology tool may be integrated with a CMP tool. For example, the optical consequences of dishing and erosion may be measured with a tool, including a NovaScan system from Nova Measuring Instruments or a NanoSpec® system from NanoMetrics.

A stand-alone tool used for CMP includes a Mirra® system from Applied Materials. Alternatively, an integrated tool such as a Mirra Mesa™ or a Reflexion™ system from Applied Materials or a Teres™ system from Lam Research may be used. An integrated tool may combine CMP with related process steps, such as a pre-clean and a post-clean to result in dry in/dry out of the substrate 100. Consumables for CMP, including pads and slurries, may be obtained from various sources, such as Rodel and Cabot.

According to an embodiment of the present invention, a combination of a first CMP process and a second CMP process may be used to form a raised contact for a substrate 100. The first CMP process performs the planarization while the second CMP process performs the recessing.

The first CMP process has a high polish selectivity for the conductor 130 relative to the underlying barrier layer 115. Thus, the first CMP process may remove the conductor 130 across the substrate 100 and uncover the upper surface 108 of the barrier layer 115, as shown in an embodiment in FIG. 1(e). The barrier layer 115 may serve as a polish stop layer since the conductor 130 is usually softer. A polish stop layer improves planarization by reducing any large or non-uniform topography that exists across the substrate 100.

A suitable slurry may be selected to accomplish a high polish selectivity for the conductor 130 relative to the barrier layer 115. The polish selectivity of the conductor 130 to the barrier layer 115 may have an average value of about 50:1–250:1. A higher polish selectivity allows the use of a thinner barrier layer 115. A thinner barrier layer 115 will result in a smaller increase in the resistance between the bond pad 104 and the conductor 130.

In one embodiment, the slurry may include an abrasive, such as Alumina or Silica, an oxidizer, such as Hydrogen Peroxide ($H_2O_2$), a passivating or film-forming agent (corrosion inhibitor), such as Benzotriazole (BTA), and a complexing agent which may be an amino acid, such as Glycine, or an organic acid/salt system, such as Citric Acid/Potassium Citrate.

Typical parameters for the first CMP process to planarize the conductor 130 include a slurry pH of about 5.0–9.0, a slurry flowrate of about 100.0–350.0 milliliters per minute, a platen rotation of about 15.0–100.0 revolutions per minute (rpm), a carrier rotation of about 15.0–100.0 rpm, and a polish pressure of about 1.0–7.0 pounds per square inch (psi). The removal rate for the conductor 130 may be about 1,000.0–14,000.0 Angstroms per minute.

The first CMP process may include two or more steps. In one embodiment, a first step, having a higher removal rate, may be used to remove most of the overburden of the conductor 130. The first step may be a timed polish or may be controlled by in situ monitoring of a parameter, such as thickness or eddy current. Then, a second step, having a lower removal rate, such as about 1,000.0–2,500.0 Angstroms per minute, may be used to clear the conductor 130 to uncover the upper surface 108 of the barrier layer 115 without breaking through to the insulator 103. The second step may be a timed polish or an endpoint polish. In one embodiment, the second step may include an overpolish time or an overpolish percentage, such as 15.0%, after detection of endpoint on the barrier layer 115. If desired, each step may be done on a separate platen or on a separate CMP system.

Removal of the bulk of the conductor 130 across the substrate 100 and uncovering the upper surface 108 of the barrier layer will leave behind a plug 135 that is inset or inlaid within the opening 105, as shown in an embodiment in FIG. 1(e). The plug includes conductor 130, seed layer 120, and barrier layer 115. The shape of the plug 135 is influenced by the shape of the opening 105. For example, the plug 135 may be a post or a stud if the opening 105 is a via. The plug 135 may be a line if the opening 105 is a trench.

An undesirable topographical change that may result from the first CMP process is dishing of the plug 135. Dishing creates a depression in the upper surface 107 of the conductor 130 within the plug 135 (inside the opening 105) relative to the surrounding insulator 103 (outside the opening 105).

Dishing may be more severe for a plug 135 with a larger lateral dimension. Proper optimization of the first CMP process will produce a first polished upper surface 107 of the plug that is approximately flat and level with the upper surface 108 of the barrier layer 115 that has been exposed, as shown in an embodiment in FIG. 1(e).

Another undesirable topographical change that may result from the first CMP process is erosion of the material in the spaces between plugs within a cluster or array 137 of plugs relative to the material in the field region far away from the cluster or array 137 of plugs. Erosion creates a depression in the spaces between plugs (within the cluster or array 137) relative to material in the field region (outside the cluster or array 137). Erosion may result in the partial or complete removal of the barrier layer 115 in the spaces between the plugs. In areas where the barrier layer 115 has been removed, erosion may further result in removal of some of the underlying insulator 103 in the spaces between the plugs.

Erosion may be more severe for a cluster or array 137 having densely-packed plugs with small spaces between the plugs. Proper optimization of the first CMP process will minimize the difference between the removal rate of material in the spaces between plugs within a cluster or array 137 of plugs and the removal rate of material outside the cluster or array 137 of plugs.

After the first CMP process has been done, a second CMP process is used to remove the barrier layer 115 outside the opening 105 and recess the uncovered portion of the insulator 103 below the upper surface 109 of the plug 135, as shown in an embodiment in FIG. 1(g). In one embodiment, the barrier layer 115 may also be removed from a portion of the sidewalls of the plug 135.

An embodiment of a structure 1000 according to the present invention is also shown in FIG. 1(g). The structure 1000 includes a plug 135 for a substrate 100. In one embodiment, the plug 135 may form a raised contact to permit input of a signal to, or output of a signal from, a bond pad 104 connected to an active area of a device in an underlying layer 102 of the substrate 100.

A suitable slurry may be selected to accomplish a high polish selectivity for both the barrier layer 115 and the insulator 103 relative to the conductor 130. The polish selectivity of the insulator 103 to the conductor 130 may have an average value of about 5:1 or greater. In one embodiment, the slurry may include an abrasive, such as Silica, and a complexing agent. The complexing agent may be Ammonium Hydroxide ($NH_4OH$) or an organic acid/salt system, such as Citric Acid/Potassium Citrate. As needed, a biocide may also be included. A relatively soft pad is used to minimize the removal of the conductor 130 and to prevent the generation of defects.

Typical parameters for the second CMP process to recess the insulator 103 include a slurry pH of about 6.0–12.0, a slurry flowrate of about 100.0–350.0 milliliters per minute, a platen rotation of about 5.0–85.0 rpm, a carrier rotation of about 5.0–85.0 rpm, and a polish pressure of about 1.0–7.0 psi. The linear velocity of the platen may be about 20.0–350.0 feet per minute. In one embodiment, the slurry pH may be about 9.0–11.0, the polish pressure may be about 4.0–6.0 psi, and the linear velocity of the platen may be about 20.0–140.0 feet per minute. When the insulator 103 is formed from a low-k material, the second CMP process may be modified to avoid fracturing or delaminating the low-k material forming the insulator 103.

In some cases, the second CMP process may be followed by a post-clean, such as a scrub, in a non-oxidizing environment with an organic acid or organic acid buffer. The pH may be selected from the range of about 2.0–6.0.

In another embodiment of the present invention, the insulator 103 as shown in FIG. 1(f), instead of the barrier layer 115 as shown in FIG. 1(e), may serve as a polish stop layer when using CMP to planarize the conductor 130 to form the plug 135. Then, the insulator 103 may be recessed directly to form the raised contact for the substrate 100. The slurry chemistry and the polish conditions and parameters may have to be optimized to achieve the desired polish selectivities and polish removal rates.

The recessing rate of the insulator 103 may be about 300.0–2,500.0 Angstroms per minute in the field region far away from the cluster or array 137 of plugs. The interior upper surface 110 of the insulator 103 may differ in height from the exterior upper surface 112 of the insulator 103. Interior refers to a location within a cluster or array 137 of plugs. Exterior refers to a location outside the cluster or array 137 of plugs. In most cases, the interior upper surface 110 of the insulator 103 is higher than the exterior upper surface 112 of the insulator 103.

Recessing the insulator 103 with the second CMP process may reduce the thickness of the conductor 130. The difference in height between the first polished upper surface 107 of the plug and the second polished upper surface 109 of the plug 135 corresponds to conductor 130 thinning. Conductor 130 thinning should be avoided except to the extent needed to planarize the upper surface 107 of the plugs in the cluster or array 137 of plugs.

Recessing of the insulator 103 combined with minimized thinning of the conductor 130 permits a net protrusion of the plug 135 above the insulator 103. The plug relief 122 is the amount of protrusion of the second polished upper surface 109 of the plug 135 relative to the interior upper surface 110 of the insulator 103. Interior refers to a location within a cluster or array 137 of plugs. The step height 124 is the amount of protrusion of the second polished upper surface 109 of the plug 135 relative to the exterior upper surface 112 of the insulator 103. Exterior refers to a location outside the cluster or array 137 of plugs. The field region includes the exterior locations that are far away from the cluster or array 137 of plugs. The oxide relief is the difference between the step height 124 and the plug relief 122.

The plug relief 122 and the step height 124 may be affected by a variety of factors, including the local pattern density (the spacing between plugs within each cluster or array 137 of plugs) and the global pattern density (the spacing between separate clusters or arrays 137 of plugs across the substrate 100). In general, narrower plugs 135 and narrower spaces between plugs 135 decreases the thinning of the conductor 130 and produces a smaller plug relief 122.

The plug relief 122 and the step height 124 may be measured and visualized with an atomic force microscope (AFM) or a high-resolution profilometer (HRP). A tool, such as a Dimension™ system from Veeco Instruments, may be used.

The nominal value for the plug relief 122 may be selected from the range of about 300.0–3,200.0 Angstroms while the nominal value for the step height 124 may be selected from the range of about 400.0–5,700.0 Angstroms. In one embodiment of the present invention, the plug relief 122 may be about 700.0–2,200 Angstroms, with a range across the substrate 100 of less than 8.0% while the step height 124 may be about 1,100.0–3,800.0 Angstroms, with a range across the substrate 100 of less than about 12.0%.

In most cases, the plug relief 122 should be controlled more tightly than the step height 124. In general, the step height 124 should not be more than about 50.0% of the original thickness of the insulator 103. Thus, minimizing the oxide relief (the difference between the plug relief 122 and the step height 124) potentially permits a desired plug relief 122 to be achieved with a thinner insulator 103.

After completion of a CMP process on a substrate 100, defect inspection may be done. A tool such as an AIT system from KLA-Tencor may be used. As needed, a scanning electron microscope (SEM) may be used for characterization and identification of specific defects. A tool that may be used includes a SEMVision™ system from Applied Materials. Automated defect classification (ADC) may be provided by post-processing software.

Defects discovered after performing CMP may not be directly caused by the CMP process. Instead, some defects may have arisen from an earlier process, such as during formation of the insulator 103, the opening 105, the barrier layer 115, the seed layer 120, or the conductor 130.

After the second CMP process is done, the protruding plug may be used to form a raised contact for a substrate. For example, a first raised contact 211 for a first substrate 210 may be interconnected to a second raised contact 221 for a second substrate 220, as shown in an embodiment in FIG. 2.

An embodiment of a structure 2000 according to the present invention is also shown in FIG. 2. The structure 2000 includes a first raised contact 211 for a first substrate 210 that is interconnected to a second raised contact 221 for a second substrate 220. In one embodiment, the raised contact 211 permits input of a signal to, or output of a signal from, a bond pad 204 connected to an active area of a device in an underlying layer 202 of the substrate 210.

The interconnection between the raised contacts 211, 221 of two or more substrates 210, 221 may be degraded by topographical changes. Such undesirable topographical changes may be caused by dishing, erosion, or conductor 130 thinning. The topographical consequences of dishing and erosion may be measured and visualized with an AFM or an HRP. A tool such as a Dimension™ system from Veeco Instruments may be used. The topographical consequences of surface roughness and uncovered defects, such as residues, scratches, and voids, may also be measured.

The nominal value and uniformity of plug relief 122 and step height 124 across the substrate 100 may be affected by erosion. Erosion may be minimized by adding dummy plugs outside the cluster or array 137 of plugs. The dummy plugs may differ from the functional plugs (in the raised contacts 211, 221) in size, shape, or layout. In one embodiment, the dummy plugs are wider than the functional plugs (in the raised contacts 211, 221) so that the height of the dummy plugs may be reduced intentionally by dishing.

Clusters or arrays 137 of dummy plugs may be strategically inserted at certain locations in the field region to modify and control the recession of the insulator 103 across the substrate 100. The locations of the dummy plugs may depend on various parameters, including the dimensions (such as length, width, thickness) of the substrate 100, the flatness of the substrate 100, the co-planarity of the substrate 100, and the locations of the functional plugs (in the raised contacts 211, 221).

In a first embodiment, the dummy plugs are only included with the functional plugs (in the raised contacts 211, 221) in the final (top) layer of the substrate 100. In a second embodiment, the dummy plugs are connected to other structures and features in one or more underlying layers of the substrate 100 to create the desired topography. In a third embodiment, dummy plugs included in two or more layers may be stacked vertically. Dummy plugs, that would otherwise float electrically, may be grounded to prevent parasitic capacitance during operation of the device in the underlying layer 102.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a method of forming raised contacts for interconnection between substrates and a structure having such raised contacts.

We claim:

1. A method comprising:
   providing a first substrate;
   forming an insulator over said first substrate;
   forming an opening in said insulator;
   forming a conductor over said insulator and in said opening;
   removing said conductor over said insulator with a first chemical-mechanical polish process to leave said conductor in said opening;
   reducing thickness of said insulator with a second chemical-mechanical polish process to permit said conductor in said opening to form a first protruding plug; and
   interconnecting said first protruding plug with a second protruding plug on a second substrate.

2. The method of claim 1 wherein said insulator comprises a Silicon Oxide.

3. The method of claim 1 wherein said insulator comprises a low-k material.

4. The method of claim 1 wherein said insulator comprises an ultra-low k material.

5. The method of claim 1 wherein said conductor comprises Copper.

6. A method comprising:
   providing a bond pad on a first substrate;
   forming a dielectric over said bond pad;
   forming a via in said dielectric to uncover said bond pad;
   forming a metal over said dielectric to fill said via;
   removing said metal over said dielectric with a first chemical-mechanical polish process to form a plug in said via;

recessing said dielectric with a second chemical-mechanical process to form a first raised contact from said plug; and interconnecting said first raised contact with a second raised contact.

7. The method of claim 6 further comprising:

forming a barrier layer after forming said via and before forming said metal; and removing said barrier layer over said dielectric after removing said metal and before recessing said dielectric.

8. The method of claim 7 wherein said first chemical-mechanical polish process comprises a first step to remove most of overburden of said conductor over said insulator.

9. The method of claim 8 wherein said first step may be a timed polish or may be controlled by in situ monitoring of a parameter, such as thickness or eddy current.

10. The method of claim 8 wherein said first chemical-mechanical polish process further comprises a second step to clear said conductor to uncover said barrier layer.

11. The method of claim 10 wherein said second step may be a timed polish or an endpoint polish.

12. The method of claim 7 further comprising:

forming a seed layer after forming said barrier layer and before forming said metal.

13. The method of claim 12 further comprising:

forming said metal over said seed layer with electroplating.

14. The method of claim 6 wherein said second chemical-mechanical polishing process comprises:

a polish pressure of about 4.0–6.0 pounds per square inch.

15. The method of claim 14 wherein said second chemical-mechanical polishing process comprises:

a linear velocity of a platen of about 20.0–140.0 feet per minute.

16. A method comprising:

providing a first substrate;

forming a dielectric over said first substrate;

forming a via in said dielectric to uncover said first substrate;

forming a metal over said dielectric to fill said via;

removing said metal over said dielectric with a first chemical-mechanical polish process to form a plug in said via;

recessing said dielectric with a second chemical-mechanical process to form a first raised contact from said plug; and interconnecting said first raised contact with a second raised contact on a second substrate to permit input or output of a signal.

17. The method of claim 16 wherein recessing said dielectric results in a plug relief of about 700.0–2,200.0 Angstroms.

18. The method of claim 16 wherein recessing said dielectric results in a step height of about 1,100.0–3,800.0 Angstroms.

* * * * *